United States Patent
Michael et al.

(10) Patent No.: US 6,665,213 B1
(45) Date of Patent: Dec. 16, 2003

(54) SENSE AMPLIFIER CIRCUIT AND METHOD FOR NONVOLATILE MEMORY DEVICES

(75) Inventors: Oron Michael, Netanya (IL); Ilan Sever, Kfar-Vitkin (IL)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/345,474

(22) Filed: Jan. 15, 2003

Related U.S. Application Data

(62) Division of application No. 09/922,177, filed on Aug. 2, 2001, now Pat. No. 6,535,426.

(51) Int. Cl.[7] .............................. G11C 16/06; G11C 7/02
(52) U.S. Cl. .............................. 365/185.2; 365/185.21; 365/210
(58) Field of Search .................. 365/185.2, 185.21, 365/185.33, 205, 207, 208, 210

(56) References Cited

U.S. PATENT DOCUMENTS

| | | | | |
|---|---|---|---|---|
| 5,218,570 A | * | 6/1993 | Pascucci et al. | 365/185.21 |
| 5,805,500 A | * | 9/1998 | Campardo et al. | 365/185.21 |
| 6,055,187 A | * | 4/2000 | Dallabora et al. | 365/185.21 |
| 6,128,225 A | | 10/2000 | Campardo et al. | 365/185.2 |
| 6,191,979 B1 | | 2/2001 | Uekubo | 365/185.25 |
| 6,219,277 B1 | | 4/2001 | Devin et al. | 365/185.21 |
| 6,243,314 B1 | * | 6/2001 | Seol | 365/185.21 |

* cited by examiner

*Primary Examiner*—Trong Phan
(74) *Attorney, Agent, or Firm*—Lisa K. Jorgenson; Andre Szuwalski

(57) ABSTRACT

A sense amplifier circuit and method are disclosed for nonvolatile memory devices, such as flash memory devices. The sense amplifier circuit includes a current source that is configurable to source any of at least two nonzero current levels in the sense amplifier circuit. The sense amplifier circuit is controlled by control circuitry in the nonvolatile memory device so that each sense amplifier circuit sources a first current level during the precharge cycle of a memory read operation, and a second current level, greater than the first current level, during the memory cell sense operation. In this way, the sense amplifier circuit consumes less power during the memory read operation without an appreciable loss in performance.

23 Claims, 2 Drawing Sheets

SENSE AMPLIFIER CIRCUIT AND METHOD FOR NONVOLATILE MEMORY DEVICES

This application is a divisional of application Ser. No. 09/922,177 filed Aug. 2, 2001 now U.S. Pat. No. 6,535,426.

BACKGROUND OF THE INVENTION

1. Technical Field of the Invention

The present invention relates to sense amplification for memory devices, and particularly to circuitry for more efficiently performing sense amplification in nonvolatile memory devices.

2. Description of the Related Art

The first nonvolatile memories were electrically programmable read-only memories (EPROMs). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, is the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EEPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMs, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Flash EPROM devices, hereinafter referred to as flash memory devices, typically include at least one array of flash memory cells organized into rows and columns of flash memory cells. The array is typically partitioned into blocks, each of which is further divided into sectors. A raw decoder and column decoder are used to select a single row and at least one column of memory cells based upon the value of an externally generated address applied to the flash memory device. Sense amplifiers are coupled to the column lines corresponding to the columns of memory cells to amplify the voltage levels on the addressed column lines corresponding to the data values stored in the addressed flash memory cells. The particular implementations of the array and the row and column decoders are known in the art and will not be described further for reasons of simplicity.

A conventional sense amplifier circuit includes a differential amplifier circuit that generally senses a voltage differential between the voltage appearing on a column line connected to a reference cell and the voltage appearing on a column line connected to an addressed memory cell, and drives a sense output signal (that is coupled to the data output pins of the flash memory device) based upon the sensed voltage differential. The conventional sense amplifier is sized and/or powered to provide a sense output signal with a relatively high slew rate so as to reduce the time needed for the sense amplifier to sense the voltage differential and suitably drive the sense output signal.

A problem exists in these conventional sense amplifiers for flash memory devices, however, in that the sense amplifier is activated during the precharge cycle (i.e., during the period of time the column lines are precharged) of a memory access operation in order to reach a stable operating state prior to the occurrence of the sense cycle (i.e., during the period of time that the addressed memory cells are coupled to the sense amplifiers). This extended period of sense amplifier activation, combined with the sense amplifiers drawing a relatively large amount of current, disadvantageously results in the conventional flash memory device dissipating a relatively high amount of power when in use. This problem is compounded by the fact that more sense amplifiers are now being used in state-of-the-art burst flash devices to allow higher bandwidth (data rate) and higher frequencies for high performance systems. Consequently, the current draw and/or power dissipation of sense amplifiers for flash memory devices is no longer a trivial consideration.

Based upon the foregoing, there is a need for a sense amplifier that more efficiently performs sense amplification in a flash memory device during memory access operations.

SUMMARY OF THE INVENTION

The present invention overcomes the shortcomings in prior systems and thereby satisfies a significant need for an improved sense amplifier for a nonvolatile memory device. In accordance with an exemplary embodiment of the present invention, the sense amplifier includes a pair of source-coupled input transistors. The control or gate terminal of a first of the input transistors is driven to a voltage level based upon a current level in an addressed memory cell during a memory access operation. The control terminal of a second of the input transistors is driven to a voltage level based upon a current level in a reference cell during the memory access operation. The sense amplifier further includes a pair of load elements, with each load element being coupled between the drain terminal of a distinct one of the input transistors and a first reference voltage source, such as a ground reference. A current source is coupled between the source terminals of the input transistors and a second reference voltage source, such as a power supply source, and configurable to draw any of at least two non-zero current levels through the current source. Control circuitry within the nonvolatile memory device controls the current source so that during at least a portion of the precharge cycle of the memory access operation the current source provides a first current level, and during the subsequent sense cycle the current source provides a second current level greater than the first current level. In this way, the sense amplifier of the exemplary embodiment of the present invention draws a relatively small amount of current (and dissipates relatively little power) during the precharge cycle and a relatively sizeable amount of current during the sense cycle of the memory access operation. As a result, the sense amplifier circuit of the exemplary embodiment of the present invention performs substantially similarly as conventional sense amplifiers for memories with reduced power.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
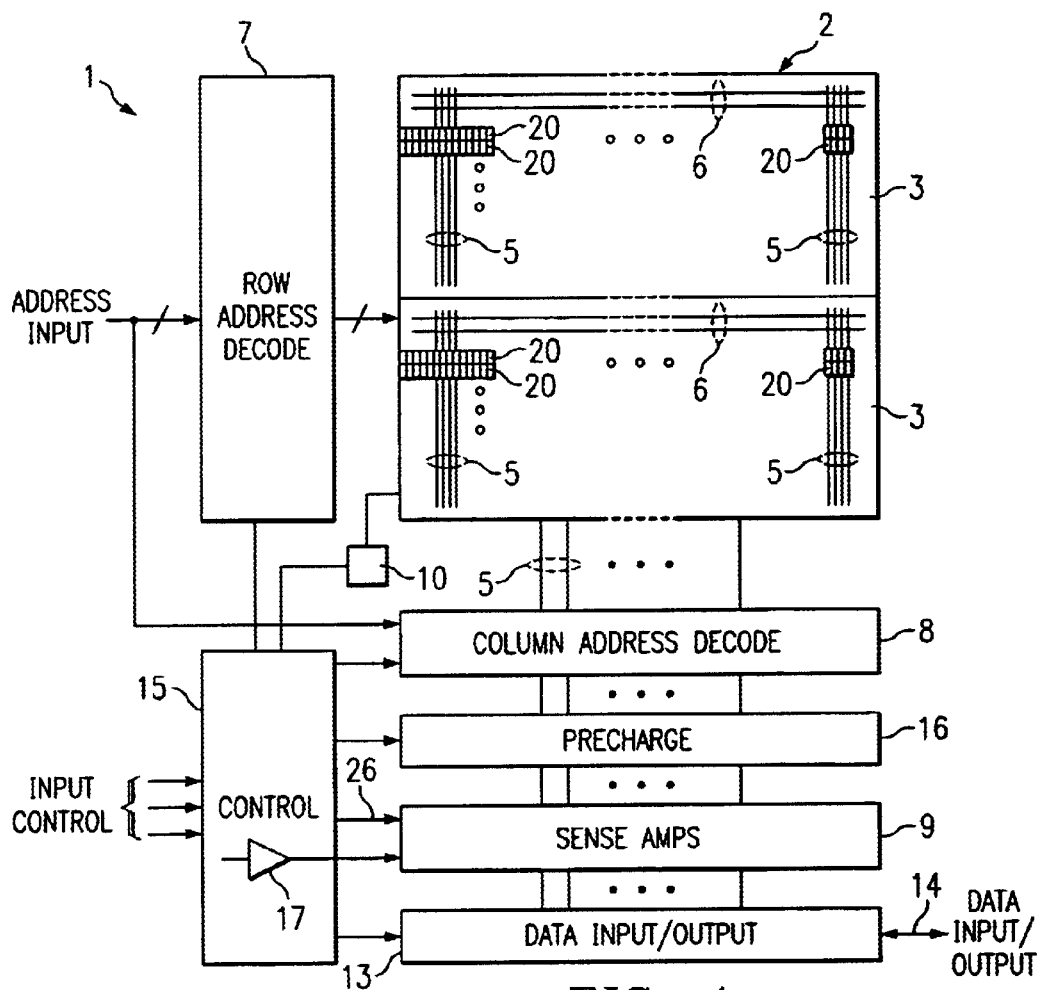
FIG. 1 is a block diagram of a flash memory device according to an exemplary embodiment of the present invention.
Figure 2:
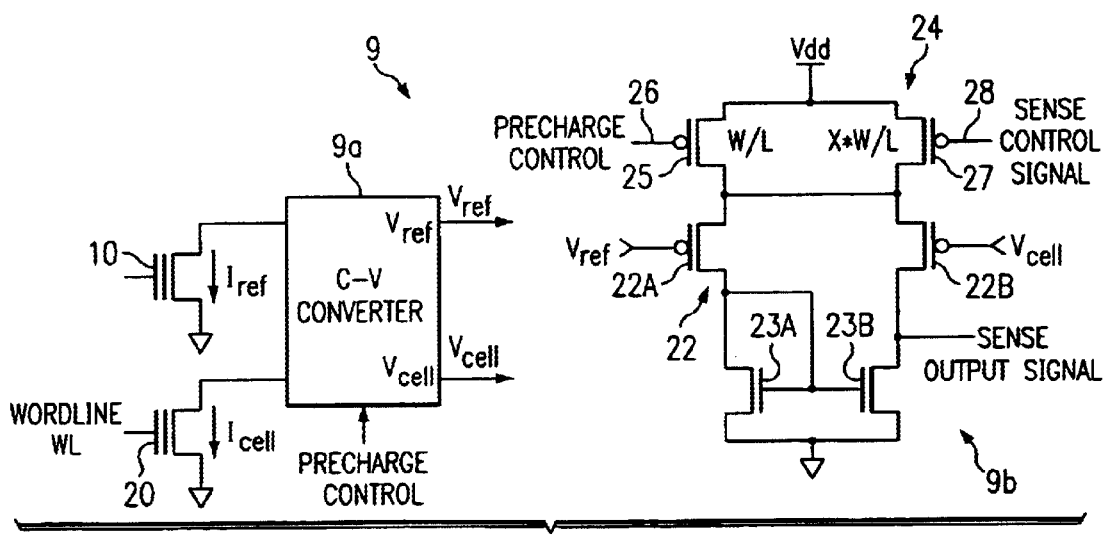
FIG. 2 is a schematic diagram of a sense amplifier circuit of the flash memory device in FIG. 1.

Referring to FIGS. 1–2, there is disclosed a nonvolatile memory device 1 according to an exemplary embodiment of the present invention. It is understood that memory device 1 may be any type of nonvolatile memory device, such as a flash memory device. Memory device 1 will be described below as a flash memory device for reasons of simplicity.

Flash memory device 1 includes one or more arrays or banks 2 of memory cells 20. Each array 2 of memory cells 20 may be arranged into rows and columns of memory cells 20. Each array 2 may be partitioned into blocks 3 of memory cells 20, with each block 3 being further partitioned into one or more sectors of memory cells 20 (not shown). Although flash memory device 1 is illustrated in FIG. 1 as having only one array/bank 2 of memory cells 20, it is understood that flash memory device 1 may include two or more arrays 2 of memory cells 20.

Array 2 is shown in FIG. 1 as being relatively sparsely populated with memory cells 20 for reasons of clarity. It is understood that array 2 is substantially entirely populated with memory cells 20 arranged in rows and columns of memory cells 20 as described above. Although memory cells 20 are described herein as flash memory cells, it is understood that memory cells 20 may be other types of nonvolatile memory cells, such as EEPROM, flash-EPROM memory cells.

The memory cells 20 in each column may be connected to a distinct column line 5, and the memory cells 20 in each row of memory cells 20 in a block 3 may be connected to a distinct row line 6. Column lines 5 may be local column lines that are coupled to main column lines (not shown in FIG. 2) for providing the selected local column lines to the periphery of array 2. The use of local and main column lines in flash memories are known in the art and will not be described in greater detail for reasons of simplicity.

Flash memory device 1 may further include row decode circuitry 7 which receives an externally generated input address or portion thereof and selects and/or activates a row of memory cells 20 based upon the input address. In particular, the memory cells 20 in the selected row is connected to the column lines 5. Row decode circuitry 7 may include logic that, for example, in response to receiving an externally generated address, drives a single row line 6 corresponding to the externally generating address to a first voltage level to activate each memory cell 20 in the row, while driving the remaining row lines 6 to another voltage level to deactivate the memory cells 20 in the remaining rows. Row decode circuitry 7 may be implemented with boolean logic gates as is known in the art.

Further, flash memory device 1 may include column decode circuitry 8 which receives an externally generated input address or portion thereof and selects one or more column lines 5 corresponding to the externally generated address. Column decode circuitry 8 may, for example, be implemented as multiplexing circuitry connected to each column line 5 in array 2 of memory cells 20. Column decode circuitry 8 is connected to each column line 5 of memory cells 20.

Flash memory device 1 may include sense amplifiers 9 that sense the current flowing through the selected column lines 5 corresponding to the data stored in the addressed memory cells 20, and drive sense amplifier output signals to voltage levels that are more easily interpreted or otherwise handled by circuitry external to array 2.

Flash memory device 1 includes a precharge circuit 16 that precharges column lines 5 during the initial portion of a memory access operation. Precharge circuit 16 is activated upon assertion of a control input signal. Upon activation, precharge circuit 16 precharges column lines 5 to a predetermined voltage level.

Flash memory device 1 may include a data input/output (I/O) circuit 13 that generally couples addressed memory cells 20 to external I/O data pins 14 of flash memory device 1. As shown in FIG. 1, data I/O circuit 13 is connected to the output of sense amplifiers 9. Flash memory device 1 may also include control circuitry 15 for receiving externally generated, input control signals and controlling the various components of flash memory device 1 to perform memory access operations. For instance, control circuit 15 may generate timing/control signals for controlling row decode circuitry 7, column decode circuitry 8, data I/O circuit 13, precharge circuit 16 and sense amplifiers 9 during a memory access operation.

Each memory cell 20 of flash memory device 1 is adapted to provide one of at least two distinct current levels that correspond to the data value stored in the memory cell 20. In order to be able to read the data value stored in a memory cell 20, memory device 1 may further include a reference cell 10 which provides a predetermined current level that is between the two current levels capable of being provided by memory cell 20. Reference cell 10 is connected to each sense amplifier 9 in flash memory device 1. It is understood that reference cell 10 may be disposed within array 2.

As explained above, conventional sense amplifier circuits are powered during both the precharge and sense cycles of a memory access operation and disadvantageously draw an excessive amount of current as a result. FIG. 2 is a diagram of a sense amplifier 9 according to the exemplary embodiment of the present invention. Sense amplifier 9 is configured as a differential amplifier circuit to sense a current differential appearing at its differential input and generate an output sense signal having a value that is based upon the sensed voltage differential. In particular, sense amplifier 9 includes a current-to-voltage converter circuit 9a and a voltage comparator circuit 9b connected to the output of the current-to-voltage converter circuit 9a. FIG. 2 shows current-to-voltage converter circuit 9a having inputs connected to a selected memory cell 20 and a reference cell 10 so as to receive a memory cell current Icell and a reference current Iref respectively. It is understood that current-to-voltage converter circuit 9a is connected to memory cell 20 via column decode circuitry 8. Current-to-voltage converter circuit 9a generates an output Vref having a reference voltage level that is based upon reference current Iref, and an output Vcell having a voltage level that is based upon memory cell current Icell.

Voltage comparator circuit 9b of sense amplifier 9 includes a pair of input transistors 22. Input transistors 22 are source coupled. A first input transistor 22A has a control or gate terminal coupled to signal Vref generated by current-to-voltage converter circuit 9a, and a second input transistor 22B has a control or gate terminal coupled to signal Vcell. A first load transistor 23A is coupled between the drain terminal of first input transistor 22A and the ground potential. A second load transistor 23B is coupled between the drain terminal of second input transistor 22B and ground. The gate terminals of first load transistor 23A and second load transistor 23B are connected together and to the drain terminal of first load transistor 23A so as to form a current mirror. The output of sense amplifier 9 is taken from the drain terminal of second input transistor 22B.

Voltage comparator circuit 9b of sense amplifier 9 further includes a current source 24 coupled between the source terminals of input transistors 22 and the high reference voltage source, Vdd. In accordance with the exemplary embodiment of the present invention, current source 24 is configurable to source two or more nonzero current levels. Current source 24 includes transistor 25 having a source terminal connected to Vdd, a drain terminal coupled to the source terminals of input transistors 22 and a control or gate terminal coupled to a precharge control signal 26. Current source 24 further includes a transistor 27 having a source terminal connected to Vdd, a drain terminal coupled to the source terminals of input transistors 22 and a control or gate terminal coupled to a sense control signal 28. Transistor 27 is sized substantially larger (i.e., has a higher channel width-to-channel length ratio) than transistor 25 so as to provide or source a greater current level than the current provided by transistor 25. In this way, current source 24 is capable of sourcing current to input transistors 22 at a first current level during the precharge cycle of a memory access operation and at a second current level during the sense cycle of the memory access operation. By setting the first current level to a relatively small level, sense amplifier 9 dissipates little power during the precharge cycle while nonetheless being able to reach the desired operating state to amplify the voltage differential appearing at the control terminals of input transistors 22.

Sense amplifier 9 of FIG. 2 shows that input transistors 22 and current source transistors 25 and 27 are p-channel field effect transistors, and load transistors 23 are n-channel field effect transistors. It is understood that, alternatively, sense amplifier 9 may be implemented with other types of transistors. Further, transistors 22, 25 and 27 may be implemented as n-channel field effect transistors and load transistors 23 may be implemented as p-channel field effect transistors in the event that the ground potential is connected to current source 24 and the high reference voltage source Vdd is connected to load transistors 23.

As stated above, voltage comparator circuit 9b of sense amplifier 9 receives a precharge control signal 26 and a sense control signal 28 for controlling the current drawn by sense amplifier 9. In ensuring a relatively smooth and low noise switching from a relatively low current operation (during the precharge cycle) to a relatively high current operation (during the sense cycle) control circuit 15 includes a relatively weak driver circuit 17 having a relatively small pull-down drive transistor. The drive strength of driver circuit 17 is relatively weak, relative to its loading (i.e., the input loading for each sense amplifier 9 plus routing capacitance appearing on sense control line 28). In this way, driver circuit 17 relatively weakly pulls sense control line 28 from Vdd towards the ground reference, thereby providing a gradual turning on of transistors 27 and a gradual increase in sense amplifier current.

Figure 3:
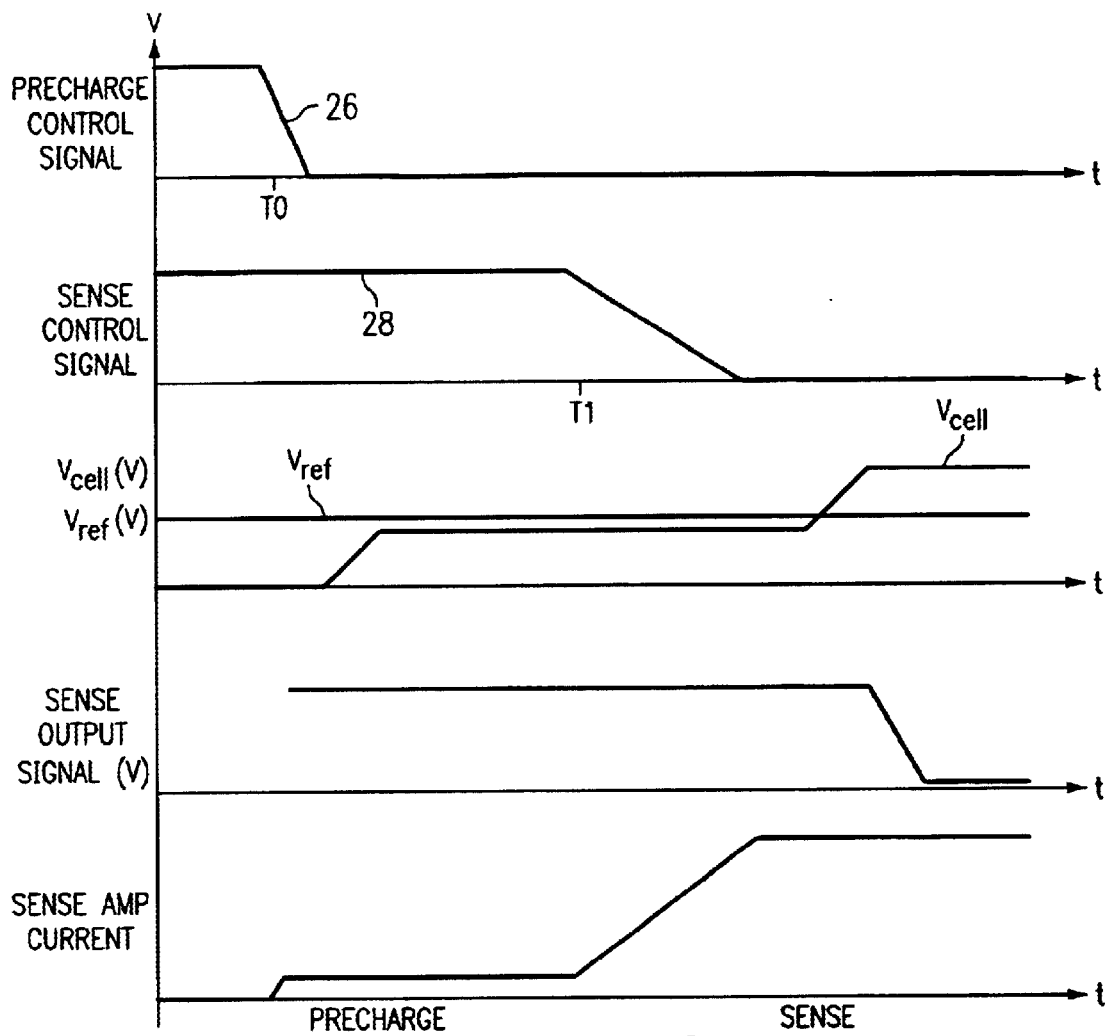
FIG. 3 is a timing diagram illustrating the operation of the flash memory device of FIG. 1 during a memory access operation.

The operation of flash memory device 1 in performing a memory access operation will be described with reference to the signal diagram of FIG. 3. Initially, a memory access operation is initiated by input control signals and an address being applied to flash memory device 1. The particular timing of the input signals applied to flash memory device 1 is known in the art and will not be described in detail for reasons of simplicity. Upon a determination that a memory read operation is to be performed, control circuit 15 initiates the precharge cycle by activating precharge circuit 16 to precharge column lines 5 of array 2. At this time, precharge control signal 26 is driven to the ground potential at time T0 which activates and/or turns on transistor 25 in current source 24 of each sense amplifier 9. During the precharge cycle, sense control signal 28 is driven to Vdd by control circuit 15. Because transistor 25 is relatively small, current source 24 sources in each sense amplifier 9a current that is relatively small. However, the amount of current in sense amplifiers 9 is sufficient for sense amplifiers 9 to reach the desired operating point and/or state. In the precharge cycle, the voltage of signal Vref generated by current-to-voltage converter circuit 9a may, for example, be slightly greater than voltage Vcell generated by current-to-voltage converter circuit 9a. FIG. 3 illustrates the relatively low current level that is drawn in each sense amplifier 9.

The precharge cycle is completed upon control circuit 13 deactivating precharge circuit 16. Each sense amplifier 9 has received at its input the current Iref generated by reference cell 10 and a current Icell corresponding to the selected memory cell 20. Following the precharge cycle, the voltage on signal Vcell generated by current-to-voltage converter circuit 9a is at a level corresponding to current Icell sunk by the selected memory cell 20, with the current level Icell being at one of two current levels based upon the data value maintained in memory cell 20. The signal Vref is at a voltage level corresponding to the reference current Iref sunk by the reference cell 10. Voltage comparator circuit 9b compares the voltage difference between voltage of signal Vcell with the voltage of signal Vref and drives the sense output signal based upon the compared voltage difference.

Immediately prior to or at the beginning of the sense cycle, control circuit 15 gradually drives at time T1 sense control signal 28 to the ground potential, which activates or turns on transistor 27. With transistor 27 being sized to source a greater amount of current than transistor 25, current source 24 of each sense amplifier 9 provides a substantially larger amount of current than the current provided during the precharge cycle. This gives each sense amplifier 9a substantially greater drive strength and/or ability to much more quickly drive the sense amplifier output signals to the intended voltage levels. FIG. 3 shows the increase in current level in a sense amplifier 9 during the sense cycle of the memory read operation. Data I/O circuit 13 receives the output of each sense amplifier 9 and drives data output pins 14 accordingly, thereby completing the memory read operation.

A benefit provided by sense amplifier 9 is that, due to the fact that sense amplifier 9 operates at a reduced current during the precharge cycle of a memory access operation, sense amplifier 9 is slower to respond to spurious transitions during the precharge cycle and is therefore more immune to noise during that time.

Figure 4:
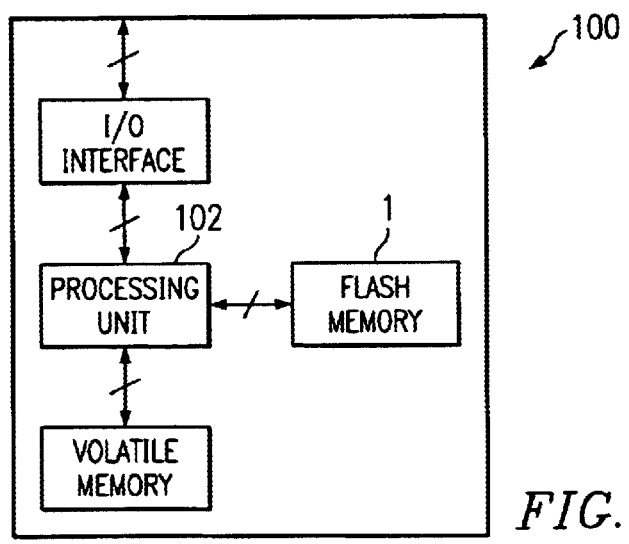
FIG. 4 is a block diagram of an electronics device in which the flash memory device of FIG. 1 is disposed.

It is understood that flash memory device 1 may be utilized in any of a number of devices requiring nonvolatile memory. For instance, flash memory device 1 may be located in an electronics system 100 (FIG. 4) having a processing unit 102 that accesses data stored in flash memory device 1. System 100 may further include an input/output (I/O) interface and/or a volatile memory coupled to processing unit 102. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sense amplifier circuit for a memory device, comprising:
    a pair of input transistors, each input transistor having a first conduction terminal coupled to the first conduction terminal of the other input transistor, a control terminal and a second conduction terminal, an output of the sense amplifier circuit being coupled to the second conduction terminal of one of the input transistors;
    a pair of load elements, each load element being coupled between the second conduction terminal of a distinct one of the input transistors and a first reference voltage source; and
    a current source coupled between the first conduction terminals of the input transistors and a second reference voltage source, and configurable to draw any of at least two non-zero current levels through the current source.

2. The sense amplifier circuit of claim 1, wherein the current source comprises:
    a first current source having a first control input; and
    a second current source connected in parallel with the first current source and having a second control input.

3. The sense amplifier circuit of claim 1, wherein the current source comprises:
    a first transistor; and
    a second transistor having a substantially larger width-to-length channel ratio than the width-to-length channel ratio of the first transistor.

4. The sense amplifier circuit of claim 1, wherein the current source comprises:
    a first transistor; and
    a second transistor sized to draw a current that is substantially greater than the current capable of being drawn through the first transistor.

5. The sense amplifier circuit of claim 1, wherein:
    the first reference voltage source is the ground reference;
    the second reference voltage source is a reference voltage source;
    the load elements are n-channel field effect transistors;
    the input transistors are p-channel field effect transistors; and
    the current source comprises a first p-channel field effect transistor coupled between the reference voltage source and the first conduction terminals of the input transistors, and a second field effect transistor coupled between the reference voltage source and the first conduction terminals of the input transistors.

6. The sense amplifier circuit of claim 1, wherein:
    the sense amplifier circuit is a sense amplifier circuit in a flash memory device.

7. The sense amplifier circuit of claim 3, wherein:
    the first transistor has a first conduction terminal coupled to the second reference voltage source, a second conduction terminal coupled to the first conduction terminals of the pair of input transistors, and a gate terminal; and
    the second transistor has a first conduction terminal coupled to the second reference voltage source, a second conduction terminal coupled to the first conduction terminals of the pair of input transistors, and a gate terminal, the gate terminals of the first and second transistors being adapted for connection to different control signals.

8. The sense amplifier circuit of claim 1, further comprising:
    a conversion circuit having at least one input for receiving at least one current signal and a pair of outputs for providing a pair of voltage signals to the control terminals of the pair of input transistors that are representative of the at least one current signal.

9. The sense amplifier circuit of claim 2, further comprising a driver circuit having an output coupled to the second control input of the second current source, the driver circuit having a drive strength to relatively gradually increase current flow in the second current source when activated.

10. A method for operating a sense amplifier circuit within a memory device during a memory access operation, comprising:

applying one or more input signals to the sense amplifier circuit;

generating, during a first time period of the memory access operation, at least one output signal having a voltage representative of the one or more input signals, the at least one output signal being generated while the sense amplifier dissipates a first non-zero current level; and generating, during a second time period of the memory access operation following the first time period, the at least one output signal while the sense amplifier dissipates a second non-zero current level greater than the first non-zero current level.

11. The method of claim 10, wherein the first time period forms at least a part of a precharge cycle of the memory access operation, and the second time period forms at least a part of a sense cycle of the memory access operation.

12. The method of claim 10, wherein the step of generating during the first time period comprises driving to an active logic state a first control signal during the first time period and applying the first control signal to the sense amplifier circuit, and the step of generating during the second time period comprises driving to the active logic state a second control signal during the second time period and applying the second control signal to the sense amplifier circuit.

13. The method of claim 12, wherein the step of driving to the active logic state the second control signal comprises gradually driving the second control signal to the active logic state, relative to the first control signal being driven to the active logic state.

14. The method of claim 10, wherein the one or more input signals comprises first and second input signals.

15. The method of claim 14, wherein the first input signal is associated with an addressed memory cell and the second input signal is associated with a reference cell.

16. A sense amplifier circuit for an integrated circuit having a plurality of memory cells for storing information, the sense amplifier circuit comprising circuitry for receiving at least one data input signal and at least one control input signal, for selectively providing an output signal having a value representative of the at least one data input signal, the sense amplifier being selectively controlled based upon the at least one control input signal to dissipate current at a first non-zero current level and at a second non-zero current level different from the first non-zero current level.

17. The sense amplifier circuit of claim 16, wherein the sense amplifier circuit receives a pair of data input signals.

18. The sense amplifier circuit of claim 16, wherein the sense amplifier circuit provides a single output signal.

19. The sense amplifier circuit of claim 16, wherein the circuitry comprises a current source that receives the at least one control input signal and sources or sinks a current level based upon the value of the at least one control input signal.

20. The sense amplifier circuit of claim 19, wherein the current sources comprise a first transistor having first conduction terminal coupled to a reference voltage source, a second conduction terminal and a control terminal adapted to be coupled to a first control input signal, and a second transistor having a first conduction terminal coupled to the reference voltage source, a second conduction terminal coupled to the second conduction terminal of the first transistor, and a control terminal adapted to be coupled to a second control input signal.

21. The sense amplifier circuit of claim 20, wherein the current source forms part of a voltage compare circuit having a pair of input transistors coupled to the current source, each input transistor being coupled to the at least one data input signal, and a pair of load elements coupled to the pair of input transistors, the output signal of the sense amplifier circuit appearing on a node coupled to one of the pair of input transistors.

22. The sense amplifier circuit of claim 20, further comprising a driver circuit having an output coupled to the control terminal of the second transistor, the driver circuit having a drive strength to relatively gradually increase current flow in the second transistor.

23. The sense amplifier circuit of claim 16, wherein the sense amplifier is disposed within a system.

* * * * *